United States Patent
Kuzniz (10) Patent No.: US 9,852,880 B2
(45) Date of Patent: Dec. 26, 2017

(54) DETECTION MODULE, INSPECTION SYSTEM AND A METHOD FOR OBTAINING MULTIPLE SENSING RESULTS

(71) Applicant: APPLIED MATERIALS ISRAEL LTD., Rehovot (IL)

(72) Inventor: Tal Kuzniz, Kfar-Saba (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/134,345

(22) Filed: Apr. 20, 2016

(65) Prior Publication Data
US 2017/0309444 A1    Oct. 26, 2017

(51) Int. Cl.
H01J 37/244    (2006.01)
H01J 37/28    (2006.01)
H01J 37/26    (2006.01)
H01J 37/22    (2006.01)

(52) U.S. Cl.
CPC .......... *H01J 37/244* (2013.01); *H01J 37/222* (2013.01); *H01J 37/261* (2013.01); *H01J 2237/24475* (2013.01); *H01J 2237/24495* (2013.01)

(58) Field of Classification Search
None
See application file for complete search history.

(56) References Cited

U.S. PATENT DOCUMENTS

| | | | | |
|---|---|---|---|---|
| 5,430,292 A * | 7/1995 | Honjo | ................ | G03F 1/86 250/310 |
| 5,557,105 A * | 9/1996 | Honjo | ................ | H01J 37/04 250/310 |
| 7,084,406 B2 * | 8/2006 | Knippelmeyer | ...... | H01J 37/244 250/287 |
| 2005/0045821 A1 * | 3/2005 | Noji | ................ | G01N 23/225 250/311 |
| 2012/0019648 A1 * | 1/2012 | Hoshino | ................ | H01J 37/26 348/80 |
| 2013/0161511 A1 * | 6/2013 | Karimata | ............ | H01J 37/261 250/307 |
| 2015/0014527 A1 * | 1/2015 | Otsuka | ................ | H01J 37/244 250/307 |
| 2016/0033658 A1 | 2/2016 | Saveliev | | |
| 2016/0203947 A1 * | 7/2016 | Aoki | ................ | H01J 37/244 250/307 |

* cited by examiner

*Primary Examiner* — Michael Logie
(74) *Attorney, Agent, or Firm* — Kilpatrick Townsend & Stockton LLP (57) ABSTRACT

A detection module that includes a readout circuit and detector having a group of sensing elements. The group is configured to detect multiple beams. The multiple beams resulted from an illumination of a substrate, by an illumination module, by multiple electron beams. The readout circuit is configured to: (a) receive selection information for selecting multiple selected sub-groups of sensing elements; wherein the group of sensing elements comprises, in addition to the multiple selected sub-groups of sensing elements, a plurality of non-selected sensing elements; (b) ignore detection signals provided from the plurality of non-selected sensing elements, and (c) generate, for each selected sub-group of sensing elements, a sensing result to provide multiple sensing results that correspond to the multiple beams; and wherein the selected sub-groups of sensing elements are selected in response to at least one working condition of the illumination module.

13 Claims, 9 Drawing Sheets

DETECTION MODULE, INSPECTION SYSTEM AND A METHOD FOR OBTAINING MULTIPLE SENSING RESULTS

BACKGROUND OF THE INVENTION

A substrate such as a wafer can be illuminated, by an illumination module, with multiple electron beams.

A collection module collects multiple collected electron beams that are formed from the illumination of the substrate.

The collection module introduces aberrations to the collected electron beams.

The multiple collected electron beams are converted to multiple light beams by an electron to photon converter. The multiple light beams as well as noise are sensed by a detector.

There is a growing need to provide a detection module that is capable of detecting the multiple light beams despite the noises the aberrations introduced by the collection module.

BRIEF SUMMARY OF THE INVENTION

According to an embodiment of the invention there may be provided a detection module that includes a readout circuit and detector having a group of sensing elements. The group is configured to detect multiple beams. The multiple beams resulted from an illumination of a substrate, by an illumination module, by multiple electron beams. The readout circuit is configured to: (a) receive selection information for selecting multiple selected sub-groups of sensing elements; wherein the group of sensing elements comprises, in addition to the multiple selected sub-groups of sensing elements, a plurality of non-selected sensing elements; (b) ignore detection signals provided from the plurality of non-selected sensing elements, and (c) generate, for each selected sub-group of sensing elements, a sensing result to provide multiple sensing results that correspond to the multiple beams; and wherein the selected sub-groups of sensing elements are selected in response to at least one working condition of the illumination module.

According to an embodiment of the invention there may be provided a method for generating multiple sensing results, the method may include receiving by a readout module selection information for selecting multiple selected sub-groups of sensing elements of a detector; wherein the detector comprises a group of sensing elements; wherein the group of sensing elements comprises, in addition to the multiple selected sub-groups of sensing elements, a plurality of non-selected sensing elements; receiving by the detector multiple beams multiple beams resulting from an illumination of a substrate with multiple electron beams; ignoring, by the readout module, detection signals provided from the plurality of non-selected sensing elements, and generating, for each selected sub-group of sensing elements, a sensing result to provide the multiple sensing results; wherein each sensing result corresponds to a beam of multiple beams. The selected sub-groups of sensing elements are selected in response to at least one working condition of the illumination module.

According to an embodiment of the invention there may be provided an inspection system that may include an illumination module that is configured to illuminate a substrate with multiple electron beams; a detection module; a collection module that is configured to provide, to the detection module, multiple beams resulting from the illumination of the substrate with the multiple electron beams; a controller that is configured to select, in response to at least one working condition of the illumination module, multiple selected sub-groups of sensing elements; and wherein the detection module comprises a detector and a readout circuit; wherein the detector comprises a group of sensing elements that are configured to detect the multiple beams; wherein the group of sensing elements comprises, in addition to the multiple selected sub-groups of sensing elements, a plurality of non-selected sensing elements; and a readout circuit that is coupled to detector and is configured to: (a) ignore detection signals provided from the plurality of non-selected sensing elements, and (b) generate, for each selected sub-group of sensing elements, a sensing result to provide multiple sensing results that correspond to multiple beams.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Figure 1:
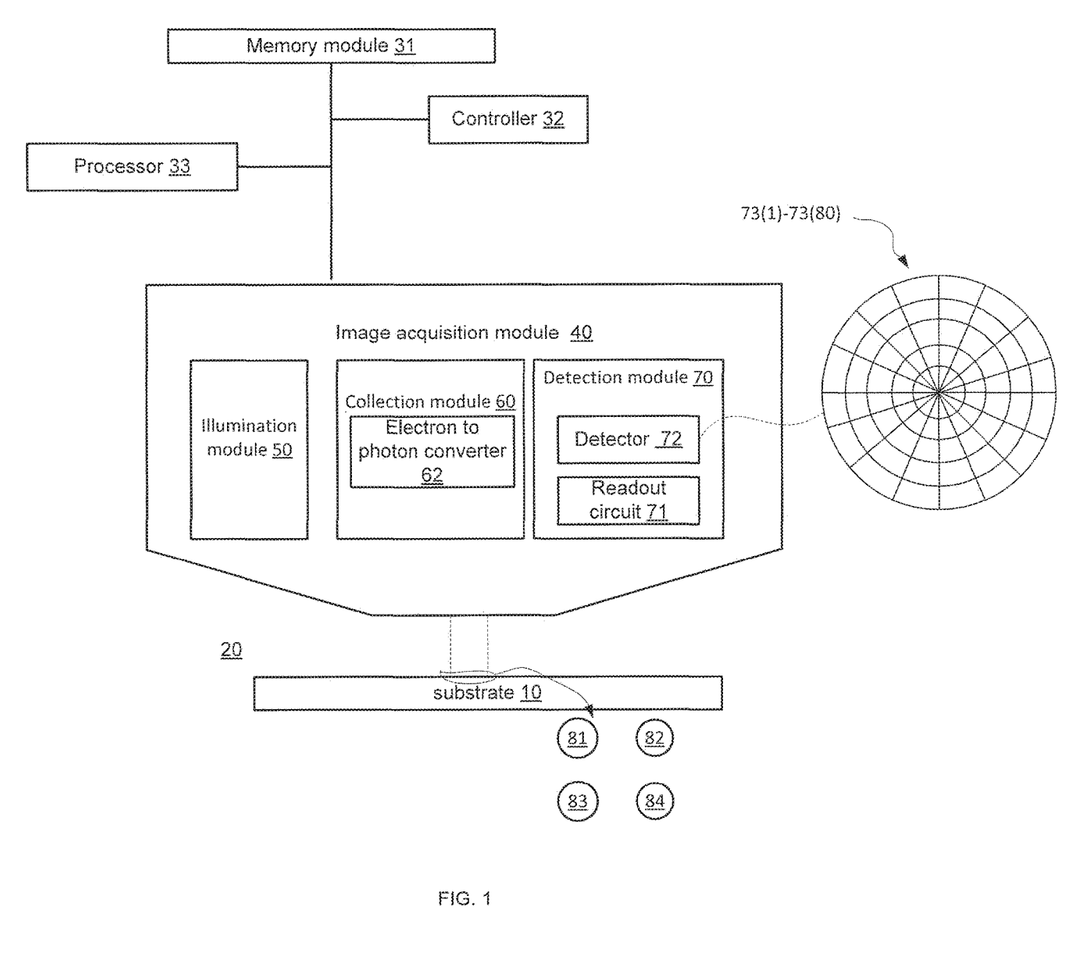
FIG. 1 illustrates a system and a substrate according to an embodiment of the invention.

FIG. 1 illustrates system 20 and substrate 10 according to an embodiment of the invention.

The substrate may be a semiconductor wafer, a flat panel, a solar panel, a lithographic mask and the like.

System 20 includes memory module 31, processor 33, controller 32 and image acquisition module 40.

The controller 32 is configured to control the operation of the various modules and/or components of system 20.

Processor 33 is configured to process sensing results provided from image acquisition module 40. The processing may include applying a defect detection algorithm, a defect review algorithm, and the like.

The memory module 31 may be configured to store sensing results, the outcome of the processing that was applied by the processor 33, inspection recipes, defect review recipes, and the like.

Image acquisition module 40 may include illumination module 50, collection module 60 and detection module 70.

Illumination module 50 and collection module 60 may be separate modules or may share one or more components. For example, the illumination module 50 and collection module 60 may share an objective lens.

The image acquisition module 40 may include one or more charged particle columns.

Illumination module 50 may be configured to illuminate substrate 10 with multiple electron beams thereby generating multiple collected electron beams. The multiple collected electron beams may be reflected and/or scattered from substrate or interact with the substrate in other manners.

FIG. 1 illustrates four electron beams 81, 82, 83 and 84. Any other number of electron beams may be generated by the illumination module 50.

Figure 9:
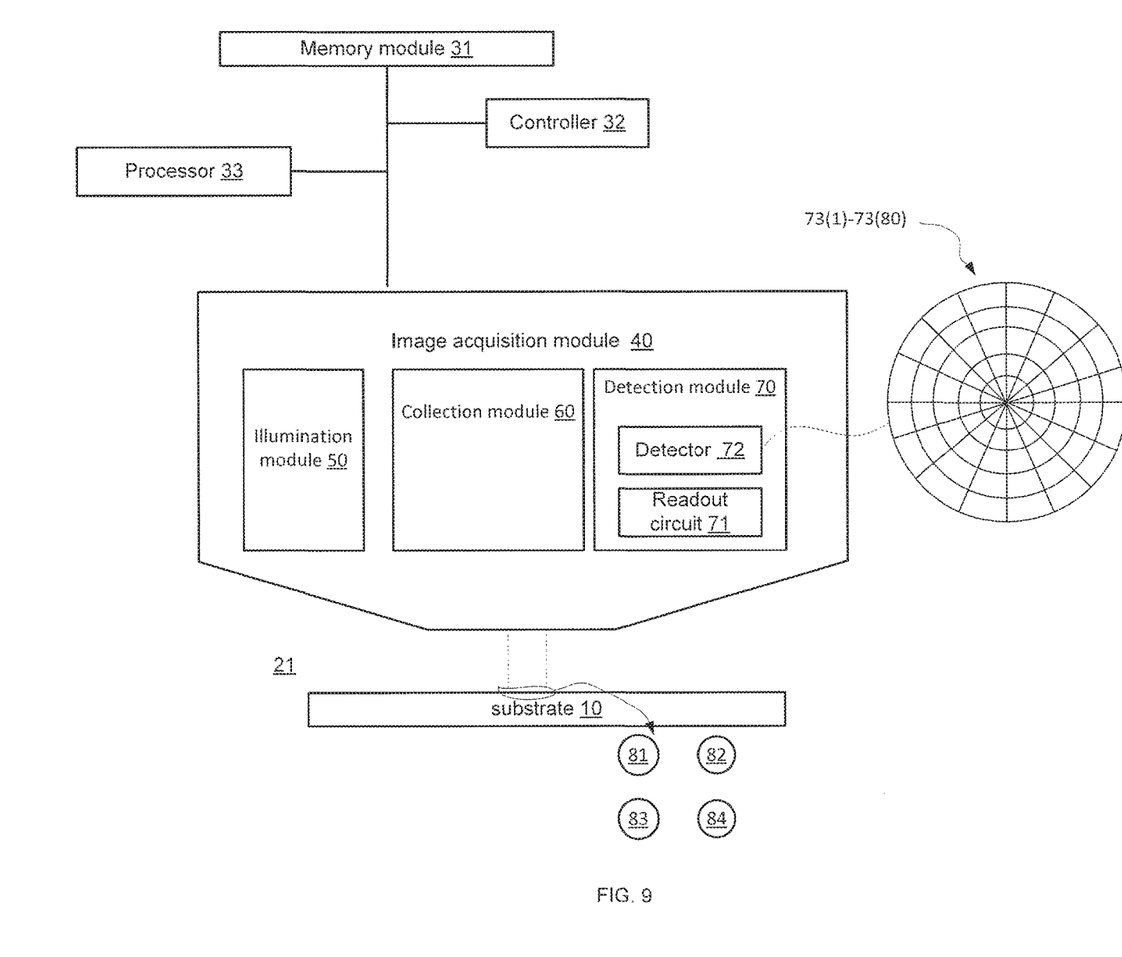
FIG. 9 illustrates a system and a substrate according to an embodiment of the invention.

Collection module 60 may include electron to photon converter 62 that is configured to convert the multiple collected electron beams to multiple light beams. It is noted that collection module 60 may have a detector that does not require an electron to photon converter 62. This is illustrated in system 21 of FIG. 9. For example—a PIN diode or other types of detector may sense multiple electron beams. For simplicity of explanation only the following text will refer to an electron to photon converter.

The collection module 60 introduces aberrations to the collected electron beams thereby changing (a) the shape and size of the collected electron beams and (b) the location of the collected electron beams.

At least some of the aberrations may be attributed due to a bending of the trajectory of the multiple collected electron beams.

Figure 2:
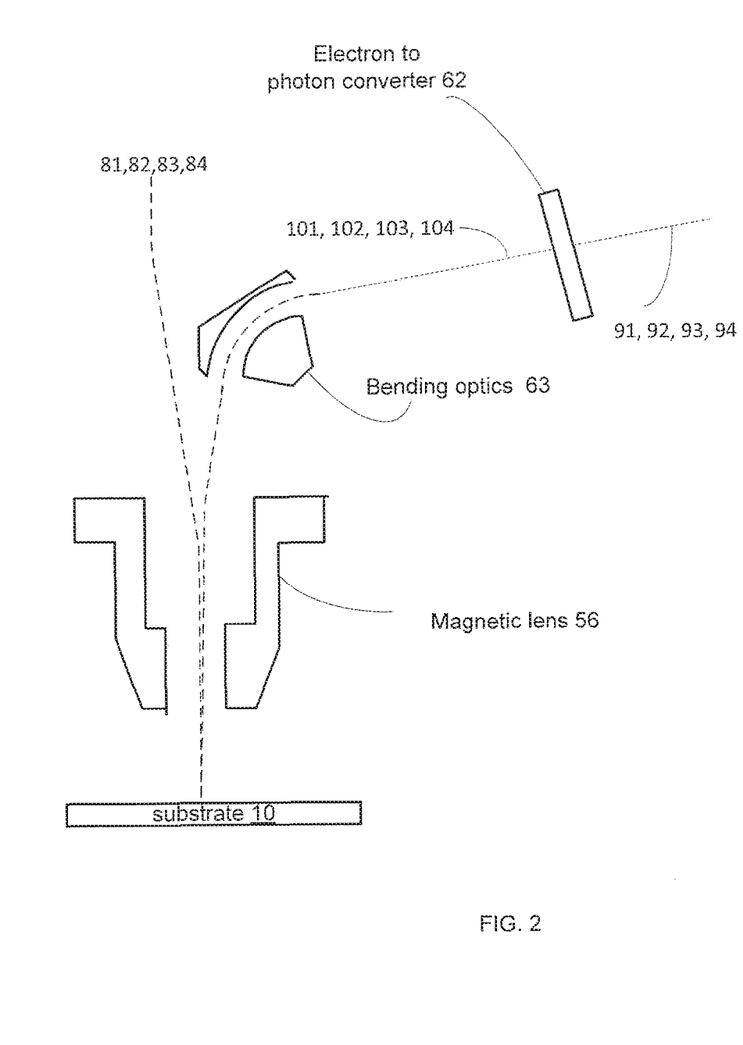
FIG. 2 illustrates a substrate and a portion of an image acquisition module of the system of FIG. 1 according to an embodiment of the invention.

FIG. 2 illustrates bending optics 63 that alters (bends) the trajectory of the collected electron beams 101, 102, 103 and 104. The bending optics 63 are positioned between magnetic lens 56 (that is a part of an objective lens) and between electron to photon converter 62. The electron to photon converter 62 converts the collected electron beams 101, 102, 103 and 104 to multiple light beams 91, 92, 93 and 94. Multiple light beams 91, 92, 93 and 94 impinge onto detector 72.

Referring back to FIG. 1, detection module 70 includes detector 72 and a readout circuit 71.

The detector 72 includes a group of sensing elements that are configured to detect the multiple light beams (denoted 91, 92, 93 and 94 in FIG. 2).

In FIG. 1 the detector 72 is illustrated as including eighty sensing elements 73(1)-73(80) that are arranged in five concentric rings, each ring includes sixteen sensing elements.

It is noted that the number of sensing elements, the shape of the sensing elements and the arrangement of the sensing elements may differ from those illustrated in any of the figures of this application. For example, the number of sensing elements may exceed the number of the multiple beams by at least a factor of three. It has been found that the aberrations introduced by the collection module 60 are responsive to at least one working condition of the image acquisition module 40.

Figure 3:
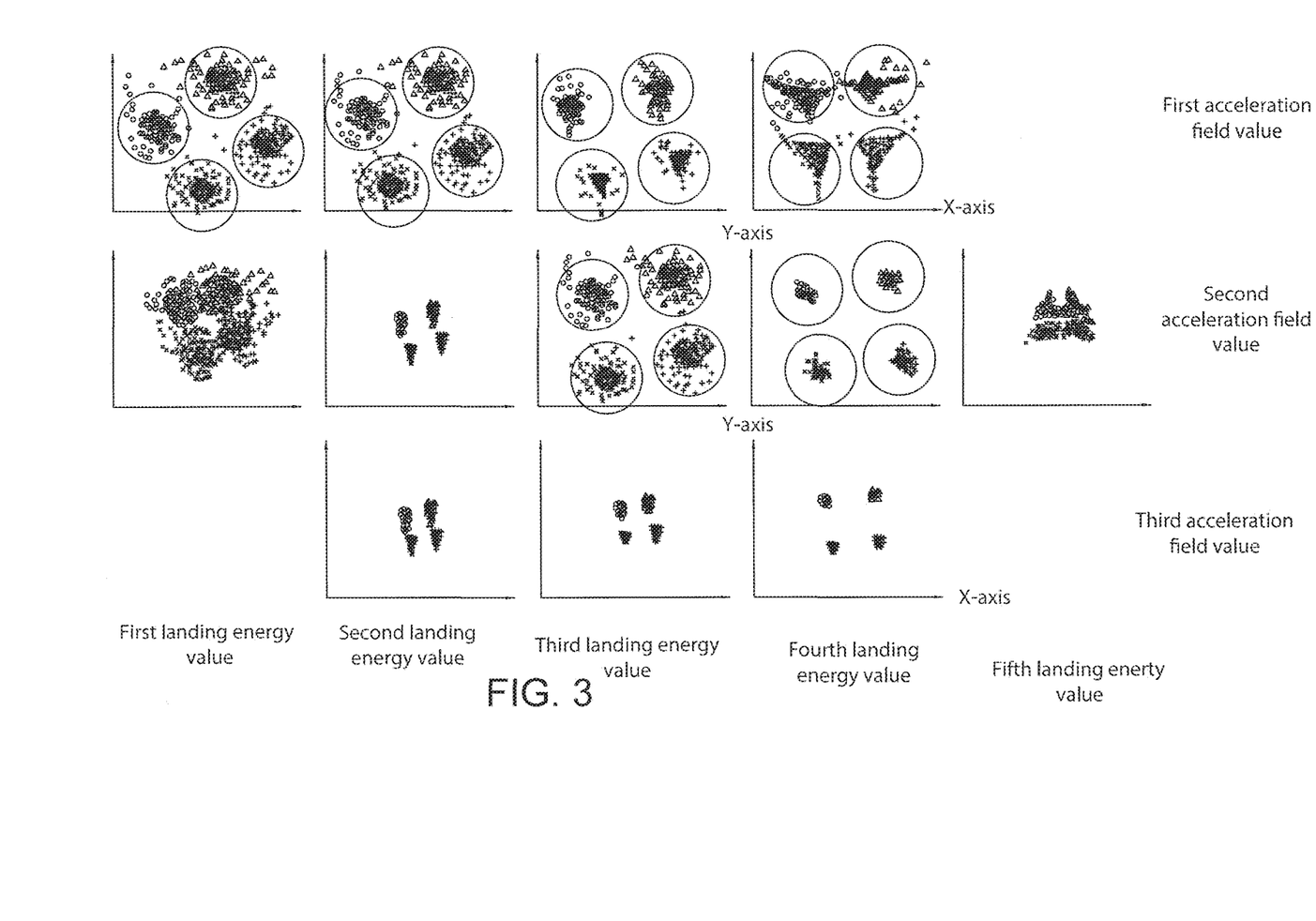
FIG. 3 illustrates few examples of the dependency between five different values of landing energies and different values of acceleration fields.

FIG. 3 illustrates few examples of the spots formed on the detector according to an embodiment of the invention.

FIG. 3 includes multiple images that correspond to different landing energy values and acceleration voltage values.

The images are arranged in five columns and three rows.

The five columns correspond to five different values of landing energies—first landing energy value, second landing energy value, third landing energy value, fourth landing energy value and fifth landing energy value—ordered from the lowest value to the highest value.

The three rows correspond to three different values of acceleration fields—first acceleration field value, second acceleration field value and third acceleration field value—ordered from the lowest value to the highest value.

FIG. 3 provides multiple examples of the shape, size and location of the multiple light beams 91, 92, 93 and 94 on the detector 72.

Referring back to FIG. 1—system 20 may calculate and/or receive a mapping between (a) values of the at least one working condition of the image acquisition module 40, and (b) shape, size and location of the multiple light beams when impinging on the detector 72.

The mapping may indicate the sensing elements of the detector 72 that will be illuminated by the multiple light beams.

The controller 32 may receive the mapping as well as information about values of the at least one working condition of the image acquisition module 40 and determine which sensing elements of detector 72 to ignore and which sensing elements of detector 72 to select.

The controller 32 may select only sensing elements that receive at least a predefined part of a light beam. The predefined part may range between 1 and 99 percent of the light beam.

The selection may provide a tradeoff between signal to noise as selecting a sensing element that senses only a small part of the light beam may reduce the overall signal to noise ratio while as ignoring several elements with small difference in response as a result of substrate pattern differences can increase the contrast (signal) and reduce the collected noise.

It is noted that the sensing elements may have a size that is smaller than the size of the cross section of the light beam. It should be noted that the size of the sensing elements may be a tradeoff—smaller sensing elements may provide better control over the signal to noise ratio but may result in more sensing elements per area of the detector 72 and thus complicate the detector and/or readout circuit 71. When there is a very small boundary "dead area" between segments then too many sensing elements may reduce the fill factor—which is the ratio between active area of the detector and the total area of the detector.

Referring back to FIG. 1—the controller 32 is configured to receive information about the at least one least one working condition of the image acquisition module 40 and select multiple selected sub-groups of sensing elements. Each sub-group of sensing elements includes one or more sensing elements and is expected to detect light of a single light beam.

The group of sensing elements also includes, in addition to the multiple selected sub-groups of sensing elements, a plurality of non-selected sensing elements.

The readout circuit 71 may be configured to ignore detection signals from non-selected sensing elements.

A change in the at least one working condition may change the selection of the multiple selected sub-groups of sensing elements.

The readout circuit 71 may be configured to generate, for each selected sub-group of sensing elements, a sensing result to provide multiple sensing results that correspond to multiple light beams.

The readout circuit 71 may apply any function on the detection signals provided by sensing elements a given selected sub-group of sensing elements to provide a given sensing result. For example, the readout circuit 71 may add the detection signals provided by the sensing elements of the given selected sub-group of sensing elements.

The output of the readout circuit 71 may include multiple sensing results.

Figure 4:
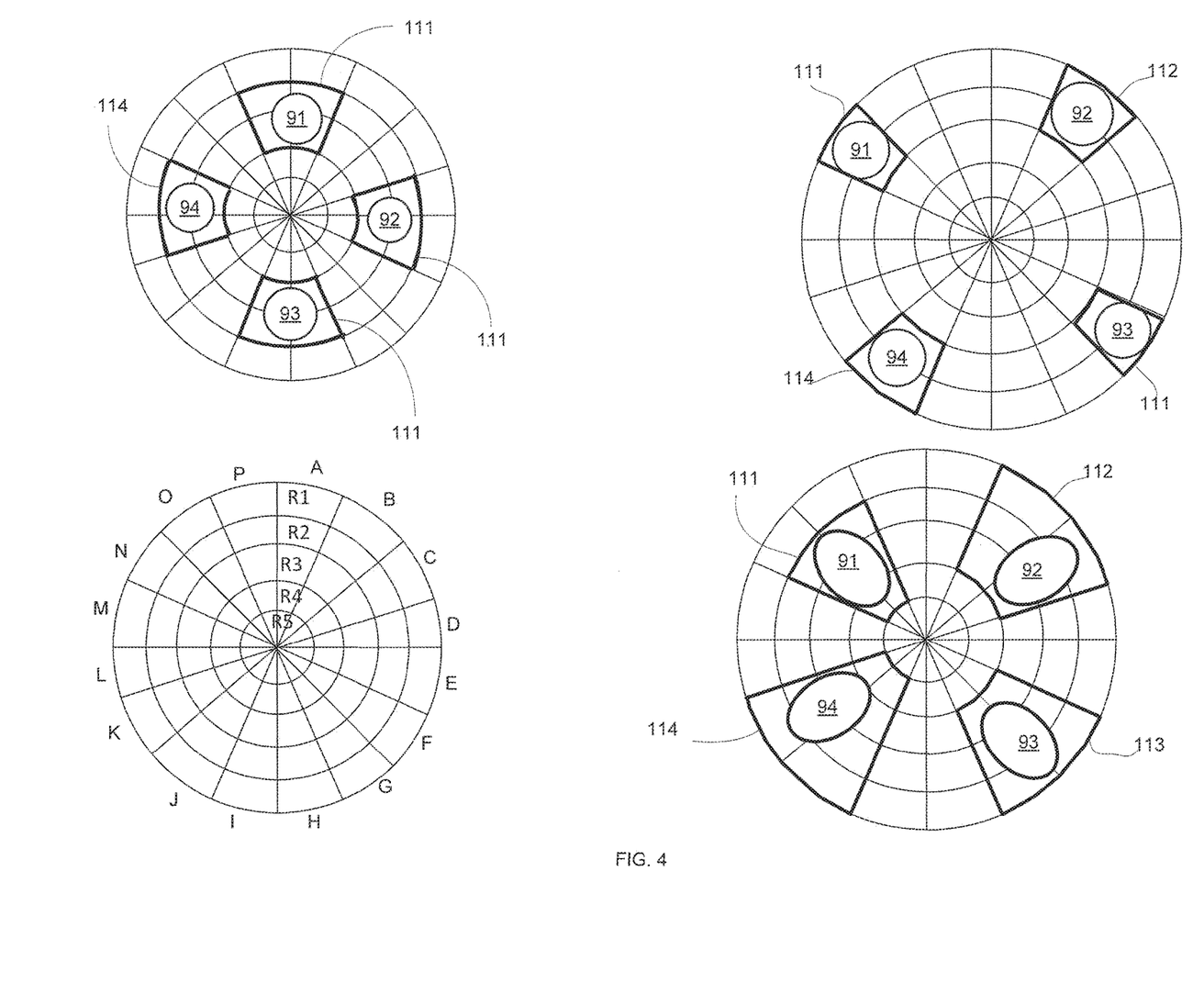
FIG. 4 illustrates a detector and multiple light beams under different working conditions according to various embodiment of the invention.

FIG. 4 illustrates a detector 72 and multiple light beams under different working conditions according to various embodiment of the invention.

The detector 72 includes four concentric rings and a circle. The four concentric rings are denoted R1 till R4—starting from the biggest ring R1 and ending at the smallest ring R4, the smallest ring surrounds circle R5. Each ring and circle has sixteen segments that are denoted A-P.

The upper left part of FIG. 4 illustrates a first working condition:
  a. Light beam 91 that impinges on a first selected sub-group of sensing elements 111 that includes sensing elements A2, P2, A3 and P3.
  b. Light beam 92 that impinges on a second selected sub-group of sensing elements 112 that includes sensing elements D2, E2, D3 and E3.
  c. Light beam 93 that impinges on a third selected sub-group of sensing elements 113 that includes sensing elements H2, I2, H3 and I3.
  d. Light beam 94 that impinges on a fourth selected sub-group of sensing elements 114 that includes sensing elements M2, N2, M3 and N3.

The upper right part of FIG. 4 illustrates a second working condition:
  a. Light beam 91 that impinges on a first selected sub-group of sensing elements 111 that includes sensing elements N1 and N2.
  b. Light beam 92 that impinges on a second selected sub-group of sensing elements 112 that includes sensing elements B1 and B2.
  c. Light beam 93 that impinges on a third selected sub-group of sensing elements 113 that includes sensing elements F1 and F2.
  d. Light beam 94 that impinges on a fourth selected sub-group of sensing elements 114 that includes sensing elements J1 and J2.

The lower right part of FIG. 4 illustrates a third working condition:
  a. Light beam 91 that impinges on a first selected sub-group of sensing elements 111 that includes sensing elements O1, O2, O3, N1, N2 and N3.
  b. Light beam 92 that impinges on a second selected sub-group of sensing elements 112 that includes sensing elements B1, B2, B3, C1, C2 and C3.
  c. Light beam 93 that impinges on a third selected sub-group of sensing elements 113 that includes sensing elements F1, F2, F3, G1, G2 and G3.
  d. Light beam 94 that impinges on a fourth selected sub-group of sensing elements 114 that includes sensing elements K1, K2, K3, J1, J2 and J3.

In each of the cases illustrated in FIG. 4 the readout circuit 71 may be configured to:
  a. Ignore detection signals that are provided by sensing elements that do not belong to the first, second, third and fourth selected sub-groups of sensing elements.
  b. Generate a first sensing result by processing detection signals of sensing elements that belong to the first sub-group of sensing elements.
  c. Generate a second sensing result by processing detection signals of sensing elements that belong to the second sub-group of sensing elements.
  d. Generate a third sensing result by processing detection signals of sensing elements that belong to the third sub-group of sensing elements.
  e. Generate a fourth sensing result by processing detection signals of sensing elements that belong to the fourth sub-group of sensing elements.

Figure 5:
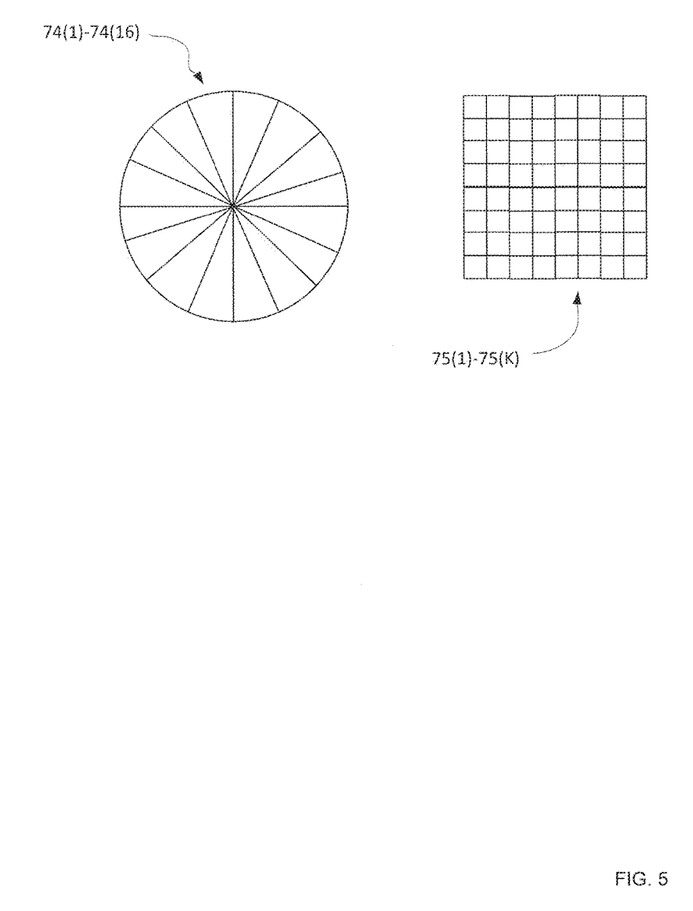
FIG. 5 illustrates detectors according to various embodiment of the invention.

FIG. 5 illustrates detector 72 according to various embodiment of the invention.

FIG. 5 shows a rectangular array of sensing elements 75(1)-75(K), K being a positive integer that exceeds 4. FIG. 5 also shows radially symmetrical sensing elements 74(1)-74(16).

Figure 6:
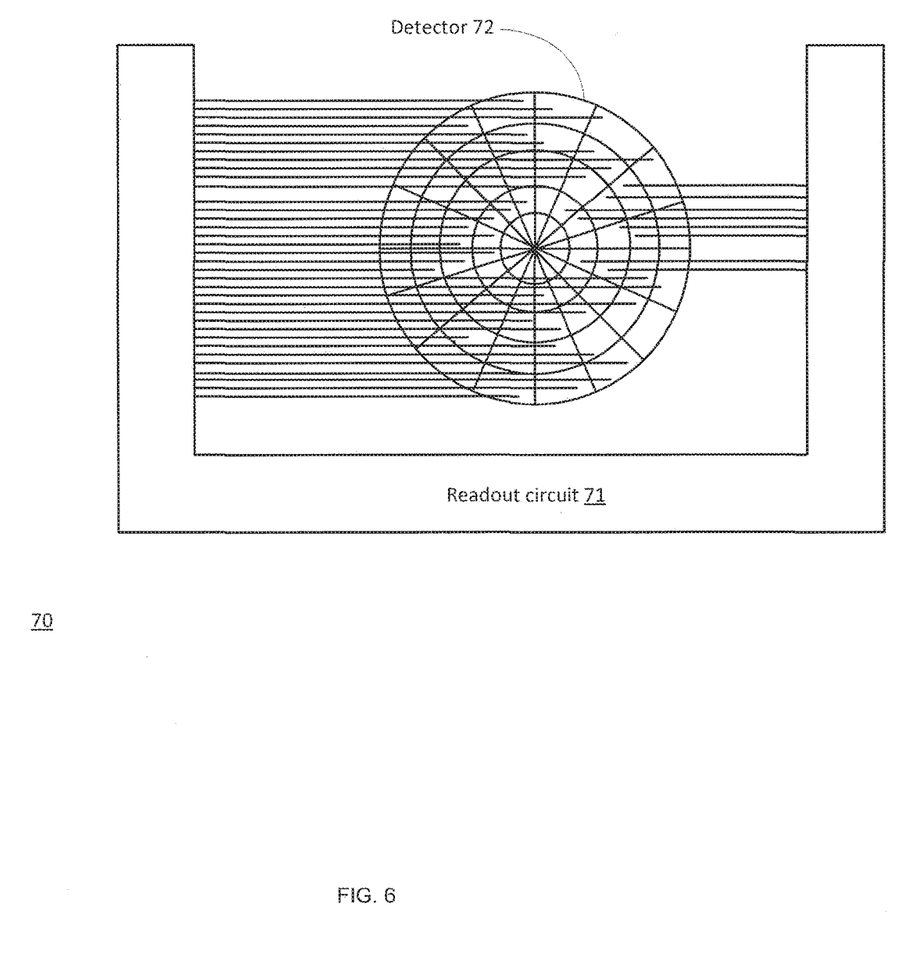
FIG. 6 illustrates a detector and a readout circuit according to an embodiment of the invention.

FIG. 6 illustrates detector 72 and readout circuit 71 according to an embodiment of the invention. Each sensing elements of detector 72 is coupled by a different connector to readout circuit 71. Any other way of independently coupling the sensing elements of detector 72 to readout circuit 71 may be provided.

The readout circuit 71 may process detection signals from sensing elements of a selected sub-group of sensing elements in the digital domain, in the analog domain or in both the digital domain and the analog domain.

Figure 7:
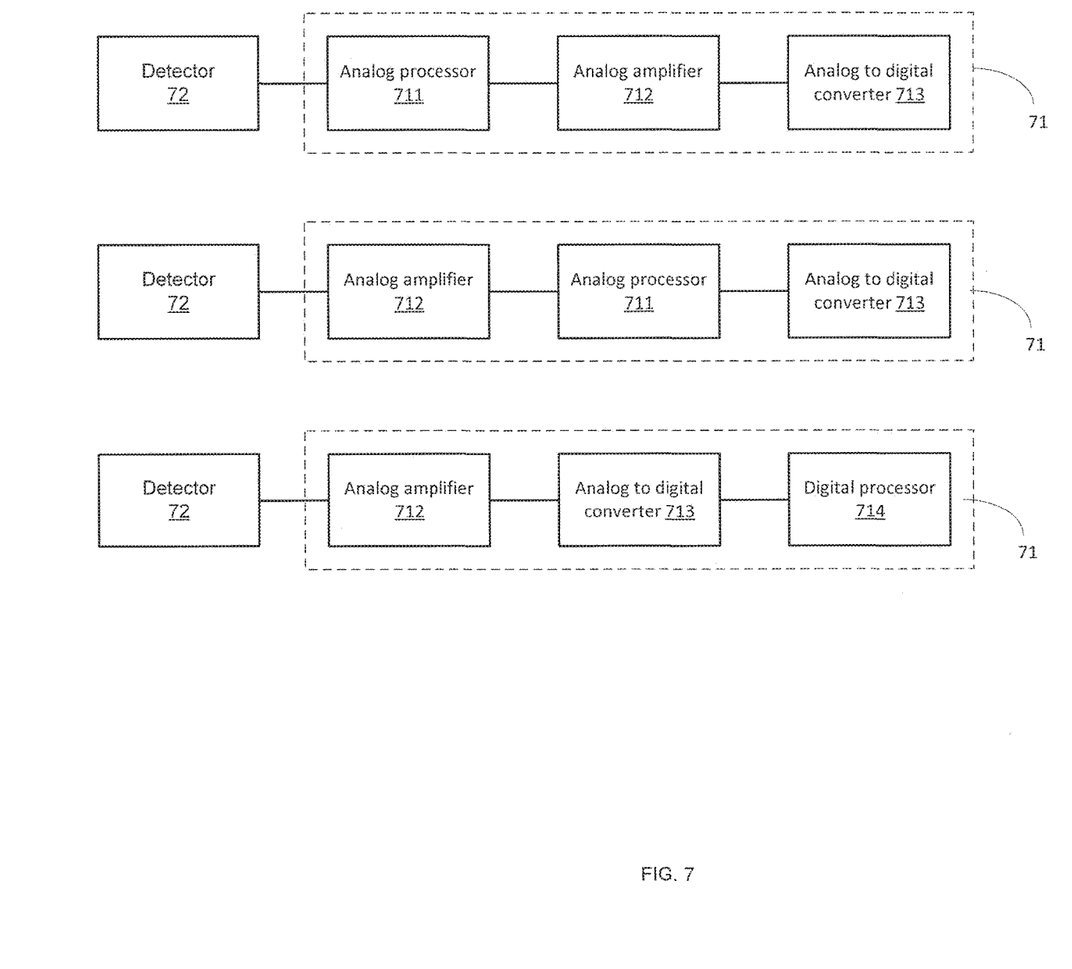
FIG. 7 illustrates a detector and readout circuits according to three embodiments of the invention.

FIG. 7 illustrates detector 72 and readout circuit 71 according to three embodiments of the invention.

According to a first embodiment, readout circuit 71 includes an analog processor 711 that is followed by an analog amplifier 712 that is followed by an analog to digital converter 713.

The analog processor 711 may process the detection signals (from detector 72) of each one of the selected groups of sensing elements to provide multiple sensing results. The multiple sensing results are fed to analog amplifier 712 that outputs amplified sensing results to analog to digital converter 713.

According to a second embodiment, readout circuit 71 include an analog amplifier 712 that is followed by analog processor 711 that is followed by an analog to digital converter 713.

The analog processor 711 may process the detection signals after the detection signals have been amplified by analog amplifier 712. The analog processor 711 may process amplified detection signals from each one of the selected groups of sensing elements to provide multiple sensing results. The multiple sensing results are fed to analog to digital converter 713.

According to a third embodiment, readout circuit 71 include an analog amplifier 712 that is followed by an analog to digital converter 713 that is followed by digital processor 714.

Detection signals from detector 72 are amplifier by analog amplifier 712 and converted to digital detection signals by analog to digital converter and then fed to digital processor 714.

The digital processor 714 may process digital detection signals from each one of the selected sub-groups of sensing elements to provide multiple sensing results.

Figure 8:
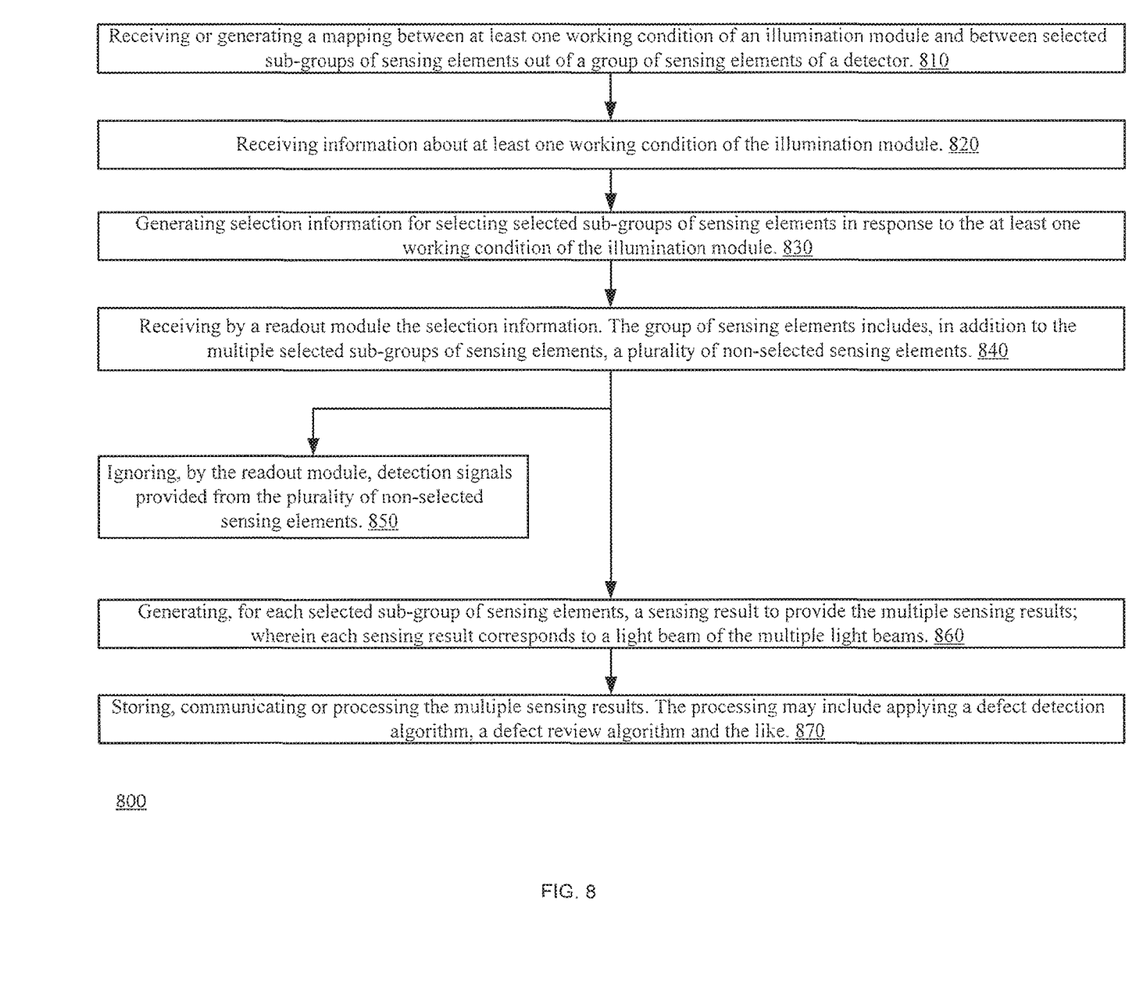
FIG. 8 illustrates a method according to an embodiment of the invention.

FIG. 8 illustrates method 800 according to an embodiment of the invention.

Method 800 may start by initialization step 810.

It is noted that the system can evaluate (in an iterative manner) which is the best configuration of the system (which sensing elements to read and how to process the detection signals of the sensing elements) for a given operating condition—the initialization step 810 may include receiving or generating a mapping between at least one working condition of an illumination module and between selected sub-groups of sensing elements out of a group of sensing elements of a detector.

Initialization step 810 may be followed by step 820 of receiving information about at least one working condition of the illumination module.

Step 820 may be followed by step 830 of generating selection information for selecting selected sub-groups of sensing elements in response to the at least one working condition of the illumination module.

Step 830 may be followed by step 840 of receiving, by a readout module, the selection information. The group of sensing elements includes, in addition to the multiple selected sub-groups of sensing elements, a plurality of non-selected sensing elements.

Step 840 may be followed by steps 850 and 860.

Step 850 may include ignoring, by the readout module, detection signals provided from the plurality of non-selected sensing elements. The ignoring reduces the noise sensed by the readout circuit.

Step 860 may include generating, for each selected sub-group of sensing elements, a sensing result to provide the multiple sensing results; wherein each sensing result corresponds to a light beam of the multiple light beams.

Step 860 may be followed by step 870 of storing, communicating or processing the multiple sensing results. The processing may include applying a defect detection algorithm, a defect review algorithm, defect classification and the like.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A detection module comprising:
   a detector comprising a group of sensing elements, the group of sensing elements being configured to detect multiple beams generated as a result of an illumination of a substrate by multiple electron beams of an illumination module; and
   a readout circuit coupled to the detector and configured to:
      receive selection information for selecting multiple selected sub-groups of sensing elements; wherein the group of sensing elements comprises, in addition to the multiple selected sub-groups of sensing elements, a plurality of non-selected sensing elements; and
      generate, for each selected sub-group of sensing elements, a sensing result to provide multiple sensing results that correspond to the multiple beams;
   wherein the selected sub-groups of sensing elements are selected based on:
      at least one working condition of the illumination module, wherein the at least one working condition comprises at least one of a landing energy of electrons of the multiple electron beams or an accelerating field applied on the electrons of the multiple electron beams; and
      a mapping between (a) values of the at least one working condition of the illumination module and (b) shape, size and locations of the multiple beams when impinging on the detector.

2. The detection module according to claim 1 wherein a size of a cross section of each one of the multiple beams exceeds a size of each sensing element of the group of sensing elements.

3. The detection module according to claim 2 wherein the readout circuit is configured to generate a given sensing result of a given selected sub-group of sensing elements by adding detection signals of each sensing element of the given selected sub-group of sensing elements.

4. The detection module according to claim 1 wherein sensing elements of the group of sensing elements are arranged in a radial symmetrical manner.

5. The detection module according to claim 1 wherein sensing elements of the group of sensing elements are radial segments of a set of concentric rings.

6. The detection module according to claim 1 wherein sensing elements of the group of sensing elements are arranged in a non-radial symmetrical manner.

7. The detection module according to claim 1 comprising a controller that is configured to select, in response to the at least one working condition of the illumination module, the multiple selected sub-groups of sensing elements.

8. The detection module according to claim 1 wherein the group of sensing elements is configured to concurrently detect the multiple beams generated as a result of the illumination of the substrate concurrently by the multiple electron beams of the illumination module.

9. An inspection system, comprising:
   an illumination module configured to illuminate a substrate with multiple electron beams;
   a detection module comprising comprises a detector, a readout circuit and a group of sensing elements;
   a collection module configured to provide, to the detection module, multiple beams that can be detected by the group of sensing elements and that result from the illumination of the substrate with the multiple electron beams;

a controller configured to select multiple selected sub-groups of sensing elements based on:
- at least one working condition of the illumination module, wherein the at least one working condition comprises at least one of a landing energy of electrons of the multiple electron beams or an accelerating field applied on the electrons of the multiple electron beams; and
- a mapping between (a) values of the at least one working condition of the illumination module and (b) shape, size and locations of the multiple beams when impinging on the detector; and wherein the group of sensing elements comprises, in addition to the multiple selected sub-groups of sensing elements, a plurality of non-selected sensing elements; and wherein the readout circuit is coupled to the detector and configured to generate, for each selected sub-group of sensing elements, a sensing result to provide multiple sensing results that correspond to multiple beams.

10. The system according to claim 9 comprising a processor that is configured to apply a defect detection algorithm on the multiple sensing results.

11. The system according to claim 9 wherein multiple beams are multiple light beams and wherein the collection module is configured to collect multiple collected electron beams and to convert the multiple collected electron beams to the multiple light beams.

12. The system according to claim 9 wherein the multiple beams are the multiple electron beams.

13. A method for generating multiple sensing results, the method comprising:

receiving by a readout module selection information for selecting multiple selected sub-groups of sensing elements of a detector; wherein the detector comprises a group of sensing elements; wherein the group of sensing elements comprises, in addition to the multiple selected sub-groups of sensing elements, a plurality of non-selected sensing elements;

receiving by the detector multiple beams resulting from an illumination of a substrate by an illumination module with multiple electron beams;

and generating, for each selected sub-group of sensing elements, a sensing result to provide the multiple sensing results; wherein each sensing result corresponds to a beam of multiple beams; and wherein the selected sub-groups of sensing elements are selected based on:
- at least one working condition of the illumination module, wherein the at least one working condition comprises at least one of a landing energy of electrons of the multiple electron beams or an accelerating field applied on the electrons of the multiple electron beams; and
- a mapping between (a) values of the at least one working condition of the illumination module and (b) shape, size and locations of the multiple beams when impinging on the detector.

* * * * *